United States Patent
Oda et al.

(10) Patent No.: US 10,404,918 B2
(45) Date of Patent: Sep. 3, 2019

(54) TRANSLATIONAL DRIVING APPARATUS AND ELECTRONIC APPARATUS USING THIS

(71) Applicant: CANON KABUSHIKI KAISHA, Tokyo (JP)

(72) Inventors: Yuki Oda, Yokohama (JP); Masanori Takahashi, Chigasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 305 days.

(21) Appl. No.: 15/283,816

(22) Filed: Oct. 3, 2016

(65) Prior Publication Data
US 2017/0104934 A1  Apr. 13, 2017

(30) Foreign Application Priority Data
Oct. 7, 2015  (JP) .................. 2015-199337

(51) Int. Cl.
*H01L 41/09* (2006.01)
*H04N 5/232* (2006.01)
(Continued)

(52) U.S. Cl.
CPC ....... *H04N 5/23287* (2013.01); *G02B 27/646* (2013.01); *G03B 5/02* (2013.01);
(Continued)

(58) Field of Classification Search
CPC ........... H04N 5/23287; H04N 5/23258; G02B 27/646; G03B 5/02; G03B 5/04; G03B 17/14; G03B 2205/0015; G03B 2205/0061; H01L 41/09; G01N 33/5438; G01N 29/022; G01N 29/036; G01N 2291/0255; G01N 2991/0256; G01N 2291/0423; B01L 2300/168; B01L 2400/0436; H03H 9/02685; H03H 9/14552
(Continued)

(56) References Cited

U.S. PATENT DOCUMENTS 6,005,723 A  12/1999  Kosaka et al.
8,536,762 B2  9/2013  Oda
(Continued)

FOREIGN PATENT DOCUMENTS

CN  104937483 A  9/2015
JP  2013-047787 A  3/2013

OTHER PUBLICATIONS

Office Action dated Feb. 2, 2019, in Chinese Patent Application No. 201610870961.7.

*Primary Examiner* — Thomas M Dougherty
(74) *Attorney, Agent, or Firm* — Venable LLP

(57) ABSTRACT

In a translational driving apparatus that is capable of reducing the drive load of a vibration-type actuator, each of a plurality of drive units has a vibration-type actuator and an output portion that outputs a driving force that occurs by driving the vibration-type actuator. A holding portion holds the drive units. A movable body has driving-force receiving parts that slidably engage with the output portions, and is driven by the drive units. A fixing portion supports the movable body so as to allow translation in any direction in a plane. The output portions receive no force from the driving-force receiving parts in a direction that intersects perpendicularly with the plane.

13 Claims, 11 Drawing Sheets

(51) Int. Cl.
    *G02B 27/64*    (2006.01)
    *G03B 5/02*     (2006.01)
    G03B 5/04       (2006.01)
    G03B 17/14      (2006.01)

(52) U.S. Cl.
    CPC ......... *H01L 41/09* (2013.01); *H04N 5/23258* (2013.01); *G03B 5/04* (2013.01); *G03B 17/14* (2013.01); *G03B 2205/0015* (2013.01); *G03B 2205/0061* (2013.01)

(58) Field of Classification Search
    USPC .................. 310/323.01–323.19, 323.21, 328
    See application file for complete search history.

(56) References Cited

U.S. PATENT DOCUMENTS

| | | |
|---|---|---|
| 8,643,252 B2 | 2/2014 | Oda et al. |
| 9,348,150 B2 | 5/2016 | Shihoh et al. |
| 9,823,630 B2 * | 11/2017 | Sumioka ................ G05B 15/02 |
| 9,871,468 B2 * | 1/2018 | Kojima .................. H02N 2/004 |
| 10,180,557 B2 | 1/2019 | Shihoh |
| 2011/0317292 A1 * | 12/2011 | Kuwano .................. G02B 7/08 |
| | | 359/824 |
| 2014/0016014 A1 * | 1/2014 | Yokoyama ........... H02N 2/0015 |
| | | 348/335 |
| 2014/0071545 A1 * | 3/2014 | Sumioka .............. G02B 27/646 |
| | | 359/813 |
| 2015/0130956 A1 * | 5/2015 | Ohashi .................... G02B 27/64 |
| | | 348/208.11 |
| 2015/0362695 A1 | 12/2015 | Shihoh |
| 2016/0020710 A1 | 1/2016 | Oda et al. |
| 2017/0082828 A1 * | 3/2017 | Sumioka .................. G02B 7/04 |

\* cited by examiner

FIRST VIBRATION MODE

SECOND VIBRATION MODE

100A

TRANSLATIONAL DRIVING APPARATUS AND ELECTRONIC APPARATUS USING THIS

BACKGROUND OF THE INVENTION

Field of the Invention

The present invention relates to a translational driving apparatus using a vibration-type actuator, and an electronic apparatus using the translational driving apparatus, and in particular, relates to a technique to reduce a drive load of the vibration-type actuator.

Description of the Related Art

There is a known image stabilization mechanism that drives a lens or an image pickup device in any direction in a plane that intersects perpendicularly with an optical axis of an image pick-up optical system as a mechanism that corrects an image blur resulting from a camera shake of an image pickup apparatus, such as a digital camera, when picking up an image. There is an image stabilization device using a vibration-type actuator as an example. For example, Japanese Laid-Open Patent Publication (Kokai) No. 2013-47787 (JP 2013-47787A) discloses an image stabilization device that enables to drive a moving plate in a first direction and second direction that are perpendicular to each other in a plane that intersects perpendicularly with an optical axis of a lens, and to rotate the moving plate around the optical axis by means of a plurality of vibration bodies.

The image stabilization device described in the above-mentioned publication has a configuration where a vibration body for driving in a first direction and a vibration body for driving in a second direction are in contact with a friction plate fixed to the moving plate. In this case, a frictional force that occurs between the vibration body for driving in the second direction and the moving plate becomes a load to the driving of the moving plate in the first direction. Moreover, a frictional force that occurs between the vibration body for driving in the first direction and the moving plate becomes a load to the driving of the moving plate in the second direction. Accordingly, power consumption of the image stabilization device becomes large, which causes a problem of reducing driving efficiency.

SUMMARY OF THE INVENTION

The present invention provides a translational driving apparatus that is capable of reducing the drive load of the vibration-type actuator.

Accordingly, a first aspect of the present invention provides a translational driving apparatus including a plurality of drive units each of which has a vibration-type actuator and an output portion that outputs a driving force that occurs by driving the vibration-type actuator, a holding portion that holds the plurality of drive units, a movable body that has driving-force receiving parts that slidably engage with the output portions, and that is driven by the plurality of drive units, and a fixing portion that supports the movable body so as to allow translation in any directions in a plane. The output portions receive no force from the driving-force receiving parts in a direction that intersects perpendicularly with the plane.

Accordingly, a second aspect of the present invention provides a translational driving apparatus including a plurality of drive units each of which has a vibration body that is configured by connecting an electro-mechanical energy conversion element and an elastic body, a driven body that is in pressure contact with the vibration body and moves relatively to the vibration body by vibration excited in the vibration body, and an output portion disposed on the driven body, a holding portion that holds the plurality of drive units, a movable body that has driving-force receiving parts that engage with the output portions to receive driving forces of the output portions, and that is driven by the plurality of drive units, and a fixing portion that movably supports the movable body. The output portions receive no force from the driving-force receiving parts in a direction of pressure that makes the vibration body be in pressure contact with the driven body.

Accordingly, a third aspect of the present invention provides an electronic apparatus including the translational driving apparatus of the first aspect and a member that is held by the movable body as an object to be positioned.

Accordingly, a fourth aspect of the present invention provides an electronic apparatus including the translational driving apparatus of the second aspect and a member that is held by the movable body as an object to be positioned.

According to the present invention, the drive load of the vibration-type actuator is reduced in the translational driving apparatus using the vibration-type actuator. This enables to drive the vibration-type actuator efficiently.

Further features of the present invention will become apparent from the following description of exemplary embodiments with reference to the attached drawings.

DESCRIPTION OF THE EMBODIMENTS

Hereafter, embodiments according to the present invention will be described in detail with reference to the drawings.

Figure 1:
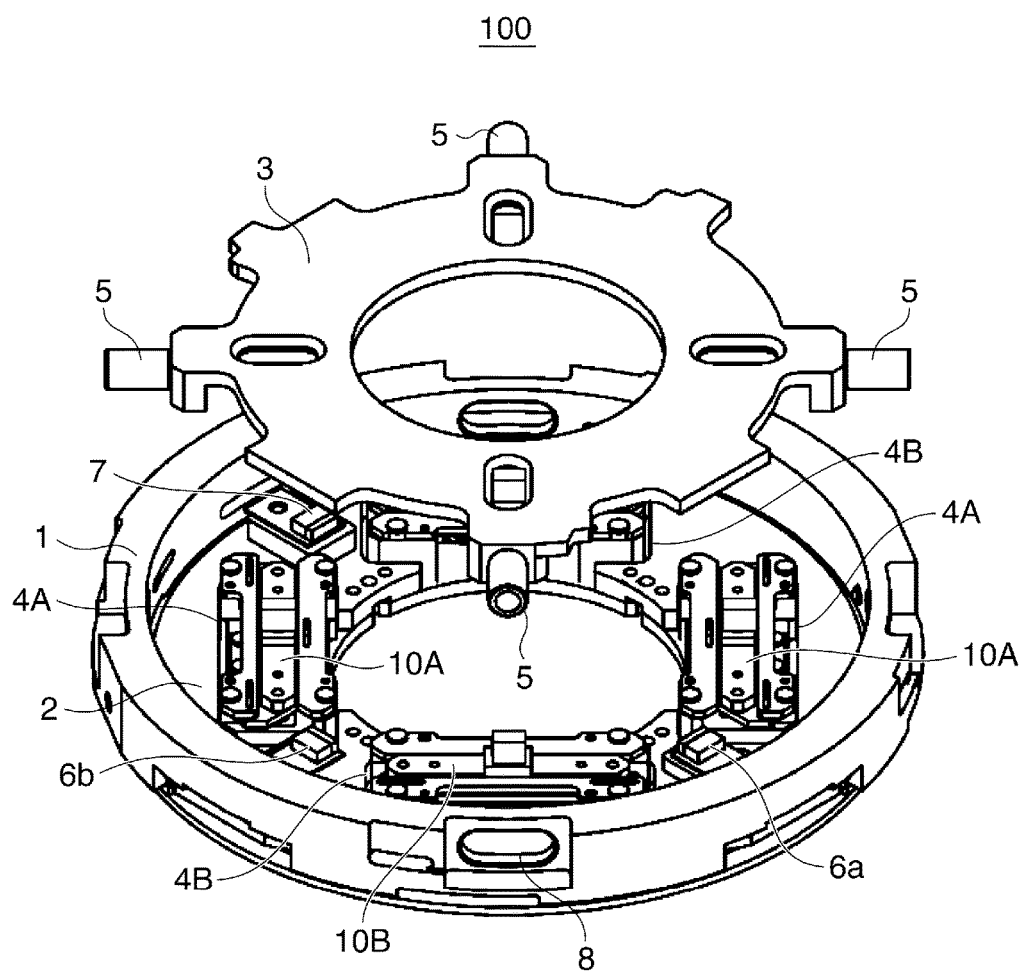
FIG. 1 is an exploded perspective view schematically showing a configuration of a translational driving apparatus according to a first embodiment of the present invention.
Figure 2:
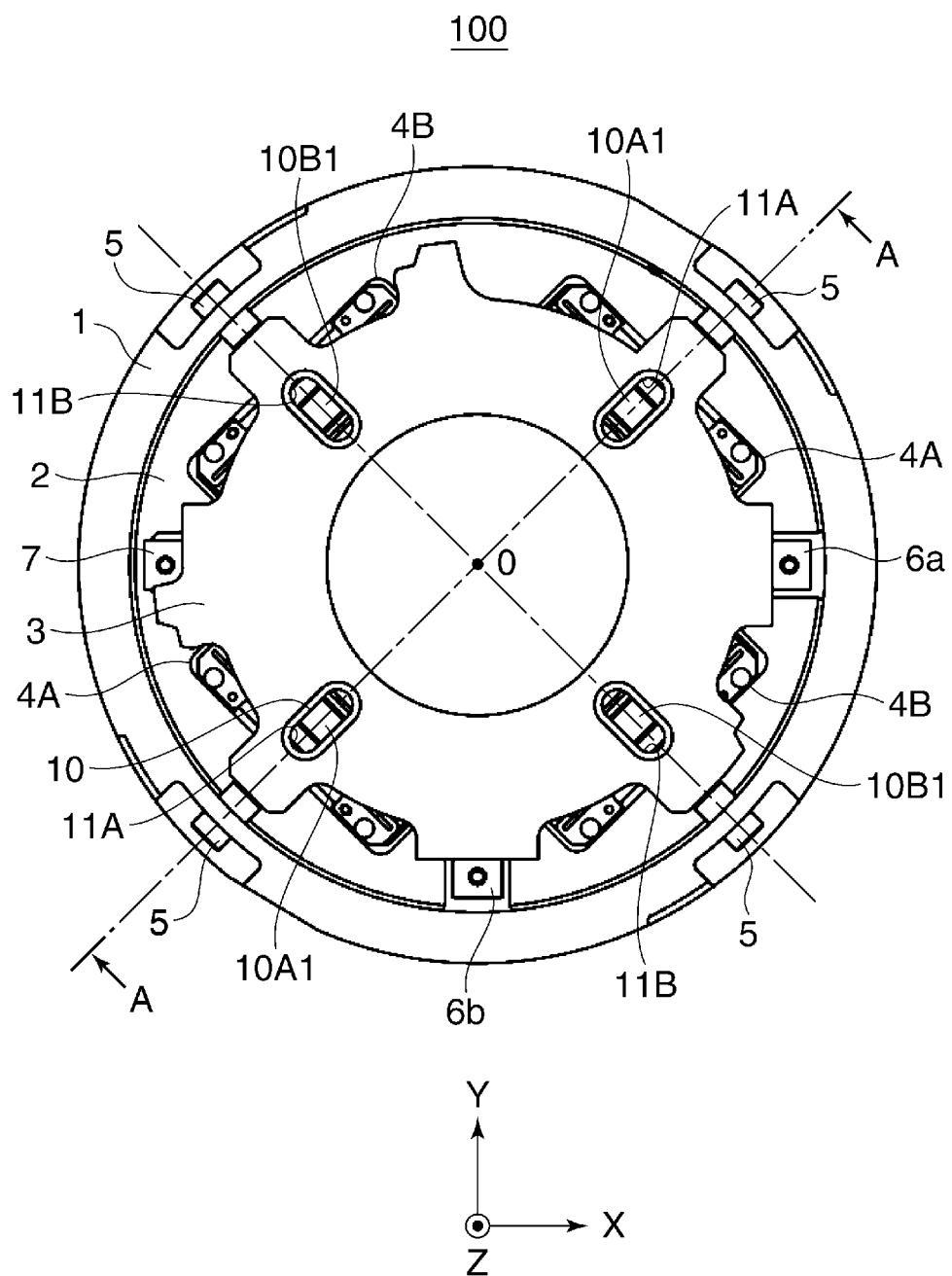
FIG. 2 is a top view schematically showing the configuration of the translational driving apparatus shown in FIG. 1.

FIG. 1 is an exploded perspective view schematically showing a configuration of a translational driving apparatus 100 according to a first embodiment of the present invention. FIG. 2 is a top view of the translational driving apparatus 100. A three-dimensional orthogonal coordinate system (X-axis, Y-axis, and Z-axis) is defined in FIG. 1 and FIG. 2 for convenience of description. A thrust direction (thickness direction) of the translational driving apparatus 100 is defined as a Z-direction. An X-direction and a Y-direction that intersect perpendicularly mutually are defined in a plane that intersects perpendicularly with the Z-direction.

The translational driving apparatus 100 has an annular fixing portion 1, an annular plate-shaped holding portion 2, an approximately annular plate-shaped movable body 3, and two pairs of drive units 4A and 4B. Four support rollers 5 that are cylindrical support members projected in radial directions are disposed on an outer periphery of the movable body 3 at equal intervals in a circumferential direction. Moreover, four roller support parts 8 that are long holes elongated in the circumferential direction are formed in the fixing portion 1 at equal intervals in the circumferential direction so as to engage with the four support rollers 5. The movable body 3 is supported by the fixing portion 1 in a movable state to the fixing portion 1, when the support rollers 5 are respectively inserted into the roller support parts 8.

The support rollers 5 smoothly slide on the inner circumferential surfaces at the long sides of the roller support parts 8. Accordingly, the movable body 3 is movable (translatable, rotatable) in an XY plane within a certain range, and its position in the Z-direction is regulated by the fixing portion 1.

A pair of first displacement sensors 6a and 6b are disposed on the fixing portion 1 so that sensing directions differ by 90 degrees ($\pi/2$ radian). Moreover, a second displacement sensor 7 is arranged (fixed) on the holding portion 2. Functions of the first displacement sensors 6a and 6b and a function of the second displacement sensor 7 will be mentioned later.

The holding portion 2 is joined to the fixing portion 1 so that one opening (XY plane) of the fixing portion 1 may be blockaded. Accordingly, the holding portion 2 and the movable body 3 are arranged in parallel. It should be noted that the holding portion 2 and the fixing portion 1 may be integrally molded with the same material. Moreover, although the holding portion 2 that has a hole in the central part is employed in this embodiment, a disk-shaped member without a hole may be employed as a support member for some uses of the translational driving apparatus 100.

The two drive units 4A and the two drive units 4B are held (fixed) on the holding portion 2. Each of the drive units 4A and drive units 4B consists of various kinds of components that constitute a vibration-type actuator as a unit. All the drive units have the same configuration.

The drive unit 4A has a vibration body 110 (see FIG. 3A) and a driven body 10A (see FIG. 1) that is frictionally driven by the vibration body 110 as main components. Moreover, the drive unit 4A has a frame member holding the vibration body 110 and a pressure member that makes the driven body 10A be in pressure contact with the vibration body 110. It should be noted that the vibration body 110 and driven body 10A are the minimum members for constituting a vibration-type actuator. The drive unit 4B also has a vibration body 110, a frame member holding the vibration body 110, a driven body 10B in which a friction drive is carried out by the vibration body 110, and a pressure member that makes the driven body 10B be in pressure contact with the vibration body 110 as main components.

Figure 3A:
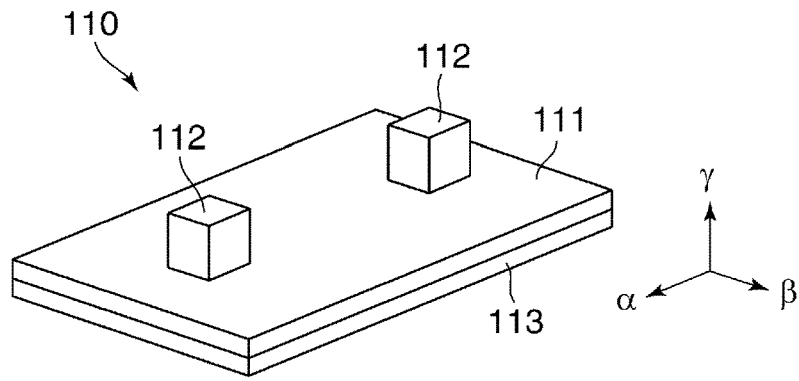
FIG. 3A is a perspective view schematically showing a configuration of a vibration body constituting a drive unit of the translational driving apparatus shown in FIG. 1.
Figure 3B:
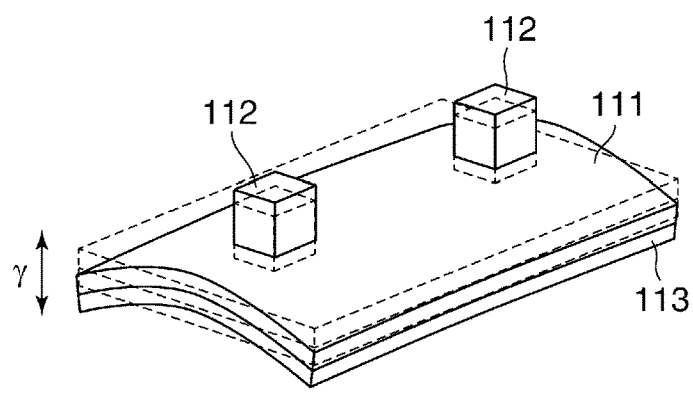
FIG. 3B is a schematic view describing a vibration in a first vibration mode excited in the vibration body.
Figure 3C:
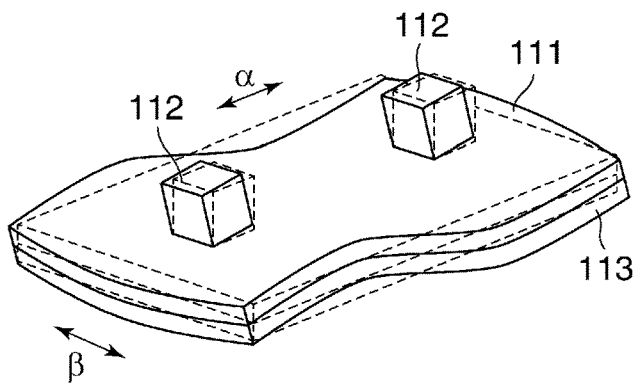
FIG. 3C is a schematic view describing a vibration in a second vibration mode excited in the vibration body.

FIG. 3A is a perspective view schematically showing the configuration of the vibration body 110 that constitutes the drive units 4A and 4B. FIG. 3B is a schematic view describing a vibration in a first vibration mode excited in the vibration body 110. FIG. 3C is a schematic view describing a vibration in a second vibration mode excited in the vibration body 110.

The vibration body 110 has a plate-shaped elastic body 111, two projections 112 disposed on one side of the elastic body 111, and a piezoelectric device 113 as an electromechanical energy conversion element that is adhered on the other side of the elastic body 111 that is opposite to the side on which the projections 112 are disposed. As shown in FIG. 3A, an direction connects the two projections 112, a $\gamma$ direction is a projecting direction of the projections 112, and a $\beta$ direction perpendicularly intersects the $\alpha$ direction and $\gamma$ direction.

Two independent electrodes (not shown) are arranged on one side of the piezoelectric device 113 in the $\alpha$ direction, and a common electrode (not shown) is disposed on the whole area of the other side. When predetermined alternating current drive voltages are applied to the two independent electrodes, the vibration in the first vibration mode and the vibration in the second vibration mode are excited in the vibration body 110 with a predetermined phase difference.

The vibration in the first vibration mode shown in FIG. 3B is a primary flexural vibration in the $\beta$ direction that has two nodes parallel to the $\alpha$ direction. It should be noted that the term "parallel" means that two directions are considered to be approximately parallel in the description in this embodiment, and is not necessarily that they are strictly parallel, and it is used as the same definition in the following description.

The projections 112 are arranged near the positions of the antinodes in the vibration in the first vibration mode, and reciprocate in the $\gamma$ direction by the vibration in the first vibration mode. On the other hand, the vibration in the second vibration mode shown in FIG. 3C is a secondary flexural vibration in the $\alpha$ direction, and has three nodes parallel to the $\beta$ direction. The projections 112 are arranged near the positions of the nodes in the vibration in the second vibration mode, and reciprocate in the $\alpha$ direction by the vibration in the second vibration mode.

The nodes in the first vibration mode and the nodes in the second vibration mode intersect perpendicularly. When the vibrations in the first and second vibration modes are generated in the vibration body 110 with the predetermined phase difference, elliptic movements (including circular movements) are generated at the front ends of the projections 112. It should be noted that the term "perpendicular" means that two directions are considered to be approximately perpendicular in the description in this embodiment, and is not necessarily that they are strictly perpendicular, and it is used as the same definition in the following description.

The driven bodies 10A and 10B (not shown in FIG. 3A, FIG. 3B, and FIG. 3C) are in pressure contact with the projections 112 where a pressure direction is the $\gamma$ direction. The vibration bodies 110 are fixed in the drive units 4A and 4B. Accordingly, when the elliptic movements are excited in the projections 112, the driven bodies 10A and 10B are frictionally driven by the projections 112, and are linearly driven in the α direction. Thus, the drive units 4A and 4B are constituted as vibration-type linear actuators that generate driving forces for linearly driving the driven bodies 10A and 10B in the α direction, respectively.

The two drive units 4A are arranged so that the driving directions of the driven bodies 10A become parallel. The two drive units 4B are arranged so that the driving directions of the driven bodies 10B become parallel. Then, the drive units 4A and the drive units 4B are arranged on the holding portion 2 so that the driving directions of the driven bodies 10A and the driving directions of the driven bodies 10B intersect perpendicularly mutually in the XY plane.

As shown in FIG. 2, square-pole-shaped output portions 10A1 are disposed on the upper surfaces of the driven bodies 10A of the drive units 4A. And square-pole-shaped output portions 10B1 are disposed on the upper surfaces of the driven bodies 10B of the drive units 4B. The output portions 10A1 of the drive units 4A slidably engage with driving-force receiving parts 11A that are long holes formed in the movable body 3 so that their long-side directions match the radial directions. The output portions 10A1 engage with the driving-force receiving parts 11A so as not to have play approximately in the driving directions (short-side directions of the driving-force receiving parts 11A) of the driven bodies 10A with dimensional accuracy that allows moving inside the driving-force receiving parts 11A in the long-side directions of the driving-force receiving parts 11A. Similarly, the output portions 10B1 of the drive units 4B slidably engage with driving-force receiving parts 11B that are long holes formed in the movable body 3 so that their long-side directions match the radial directions. The output portions 10B1 engage with the driving-force receiving parts 11B so as not to have play approximately in the driving directions (short-side directions of the driving-force receiving parts 11B) of the driven bodies 10B with dimensional accuracy that allows moving inside the driving-force receiving parts 11B in the long-side directions of the driving-force receiving parts 11B.

Accordingly, when the drive units 4A are driven, the output portions 10A1 apply the driving forces to the movable body 3, and the movable body 3 is linearly translated in the driving direction of the driven bodies 10A. In this case, the output portions 10B1 move smoothly inside the driving-force receiving parts 11B in their long-side direction. Similarly, when the drive units 4B are driven, the output portions 10B1 apply the driving forces to the movable body 3, and the movable body 3 is linearly translated in the driving direction of the driven bodies 10B. In this case, the output portions 10A1 move smoothly inside the driving-force receiving parts 11A in their long-side direction.

In the translational driving apparatus 100 constituted as mentioned above, the output portions 10A1 and 10B1 never receive the driving forces from the driving-force receiving parts 11A and 11B in the Z direction. Moreover, frictional force that occurs between the inner surfaces of the output portions 10A1 and driving-force receiving parts 11A and frictional force that occurs between the inner surfaces of the output portions 10B1 and driving-force receiving parts 11B do not increase drive loads of the drive units 4A and 4B approximately. Furthermore, the position of the movable body 3 in the Z direction is determined by the support rollers 5 and the roller support parts 8, and is not regulated by the positions of the output portions 10A1 and 10B1 in the Z direction. That is, the pressure force in the Z direction does not act between the movable body 3 and drive units 4A and 4B.

Accordingly, the translational driving apparatus 100 is able to translate the movable body 3 in any directions in the XY plane approximately only by the driving forces that occur at the output portions 10A1 and 10B1 when the drive units 4A and 4B are driven. Moreover, the drive loads of the drive units 4A and 4B are not affected by the movable body 3, and are approximately determined depending on the configuration of the drive units 4A and 4B themselves. Accordingly, the translational driving apparatus 100 is able to translate the movable body 3 in the XY plane by efficiently giving the driving forces generated by the drive units 4A and 4B to the movable body 3.

Next, the positional relationship between the drive units 4A and 4B, the support rollers 5, the first displacement sensors 6a and 6b, and the second displacement sensor 7 in the translational driving apparatus 100 will be described.

As shown in FIG. 2, the driving-force receiving parts 11A and 11B that receive the driving forces of the output portions 10A1 and 10B1 are respectively disposed on lines each of which connects the two support rollers 5 that face across the center of the movable body 3. That is, the driving-force receiving parts 11A and 11B and the output portion 10A1 and 10B1 are respectively disposed at the positions close to the support rollers 5. In this place, the support rollers 5 are parts that determine the position of the movable body 3 with respect to the fixing portion 1 in the Z direction. Accordingly, even if rigidity of the movable body 3 is insufficient and modification occurs in the movable body 3, the effect is reduced and the driving accuracy at the time of translating the movable body 3 is improved.

The first displacement sensor 6a detects a moving amount of the movable body 3 in the +Y direction. The first displacement sensor 6b detects a moving amount of the movable body 3 in the X direction. And the second displacement sensor 7 detects a moving amount of the movable body 3 in the −Y direction. A control apparatus (drive circuit, not shown) that drives the translational driving apparatus 100 controls translation of the movable body 3 on the basis of deviation between the information (outputs) from the first and second displacement sensors 6a, 6b, and 7 and the moving amount that is obtained by compositing the driving force vectors of the drive units 4A and 4B.

It is preferable that the sensing direction of the first displacement sensor 6a is coincident with the sensing direction of the second displacement sensor 7. In this embodiment, their sensing directions are identical in the Y direction (+Y direction and −Y direction). Even if the movable body 3 rotates, a difference occurs between the moving amount detected by the first displacement sensor 6a and the moving amount detected by the second displacement sensor 7. Accordingly, the rotation angle of the movable body 3 is computable by calculating this difference using a trigonometric function, etc. When the drive units 4A and 4B are controlled so as to offset the detected rotation angle, the translation of the movable body 3 is controlled precisely while reducing rotation of the movable body 3.

It should be noted that the first displacement sensor 6a and second displacement sensor 7 may detect the moving amount of the movable body 3 in the X direction and the first displacement sensor 6b may detect the moving amount of the movable body 3 in the Y direction. For example, each of the first and second displacement sensors 6a, 6b, and 7 detects the displacement of the movable body 3 by projecting light toward a straight-line scale disposed on the movable body 3 and by receiving reflected light. However, the configuration of each of the sensors is not limited to this.

Figure 4:
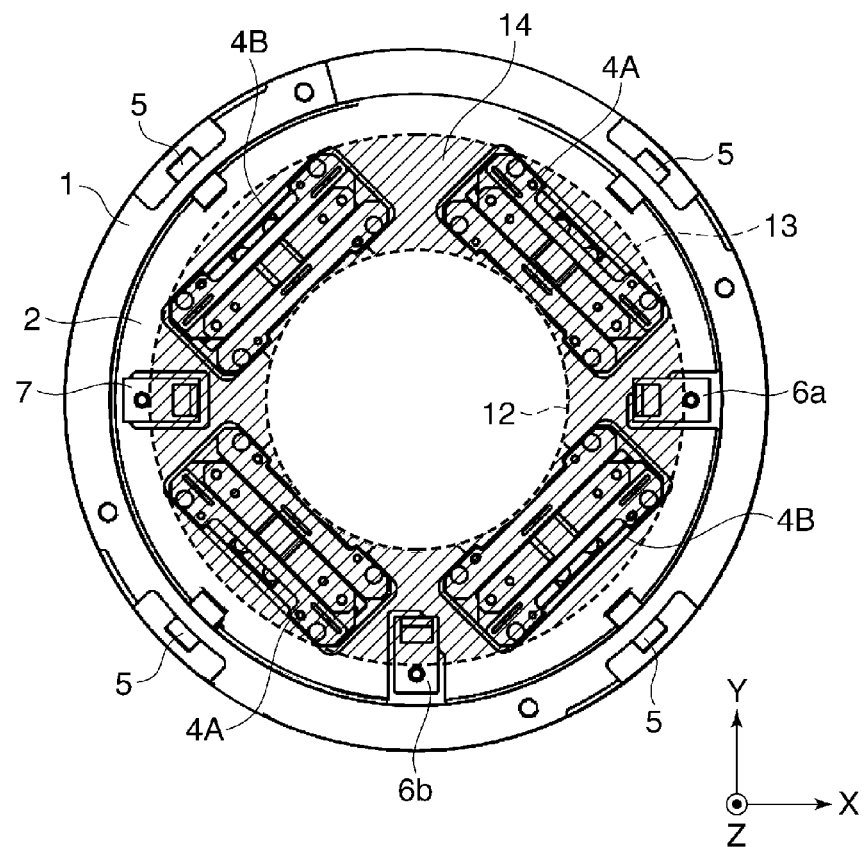
FIG. 4 is a plan view showing a positional relationship between drive units and support rollers in the translational driving apparatus shown in FIG. 1.

FIG. 4 is a plan view showing a positional relationship between the drive units 4A and 4B and the support rollers 5 in the translational driving apparatus 100. A first circle 12 in FIG. 4 is a circle of which radius is the minimum distance from the center O of the holding portion 2 (the fixing portion 1) to the drive units 4A and 4B, and is a circle of the maximum diameter that does not include the drive units 4A and 4B. Moreover, a second circle 13 in FIG. 4 is a circle of which radius is a distance from the center O of the holding portion 2 (the fixing portion 1) to the furthest point (part) of the drive units 4A and 4B, and is a circle of the minimum diameter that includes the drive units 4A and 4B. The first circle 12 and second circle 13 are concentric circles of which the center O is common.

The drive units 4A and 4B are arranged within a ring-shaped area 14 outside the first circle 12 and inside the second circle 13 when they are viewed in the Z direction. Moreover, the first and second displacement sensors 6a, 6b, and 7 are arranged at the positions that do not overlap with the drive units 4A and 4B, and the support rollers 5 are arranged in the area outside the second circle 13 when they are viewed in the Z direction. Such arrangement allows keeping space (a center hole) inside the first circle 12 in the holding portion 2.

Since the center hole is formed in the holding portion 2, the translational driving apparatus 100 is usable as an image stabilization device disposed in a lens barrel by arranging an image stabilization lens in the center hole of the movable body 3. Moreover, the translational driving apparatus 100 is usable as an image stabilization device in which an image pickup device is arranged in the center hole of the movable body 3 and wires of the image pickup device pass through the center hole of the holding portion 2. Furthermore, when the translational driving apparatus 100 is applied to an XY table, signal lines for driving the drive units 4A and 4B can be wired through the center hole of the holding portion 2.

Figure 5:
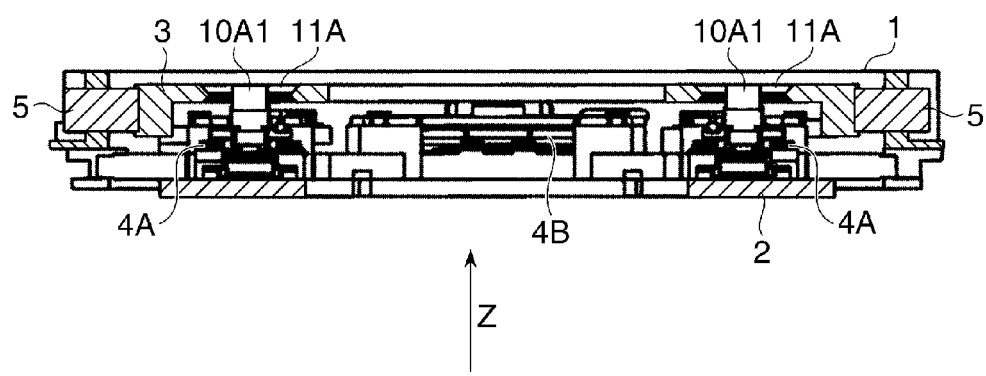
FIG. 5 is a sectional view taken along the A-A line in FIG. 2.

FIG. 5 is a sectional view taken along the A-A line in FIG. 2, and is the sectional view that passes the centers of the support rollers 5 that are positioned symmetrically about the center O of the holding portion 2. The support rollers 5 are arranged at the height that overlaps with the drive units 4A and 4B in the Z direction. This thins down the translational driving apparatus 100 as compared with a configuration in which the support rollers 5 are arranged at the height that does not overlap with the drive units 4A and 4B.

As described above, the translational driving apparatus 100 is able to translate the movable body 3 without receiving force other than the driving forces of the drive units 4A and 4B approximately. Moreover, the drive units 4A and 4B are able to drive the movable body 3 without receiving an effect of external force approximately. Accordingly, the drive units 4A and 4B are able to translate the movable body 3 by giving the driving forces that occur by driving to the movable body 3 efficiently.

Figure 6:
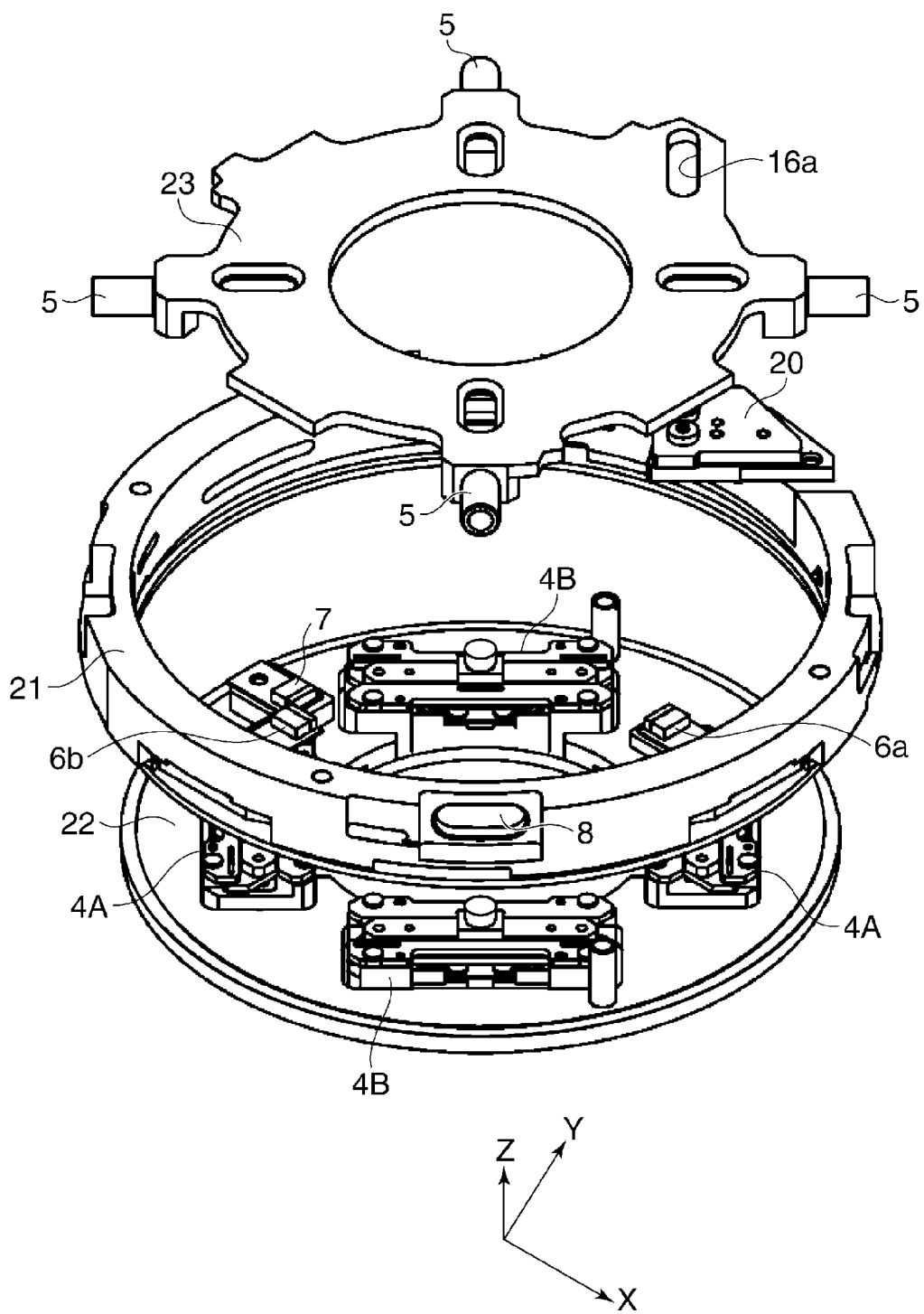
FIG. 6 is an exploded perspective view schematically showing a configuration of a translational driving apparatus according to a second embodiment of the present invention.
Figure 7:
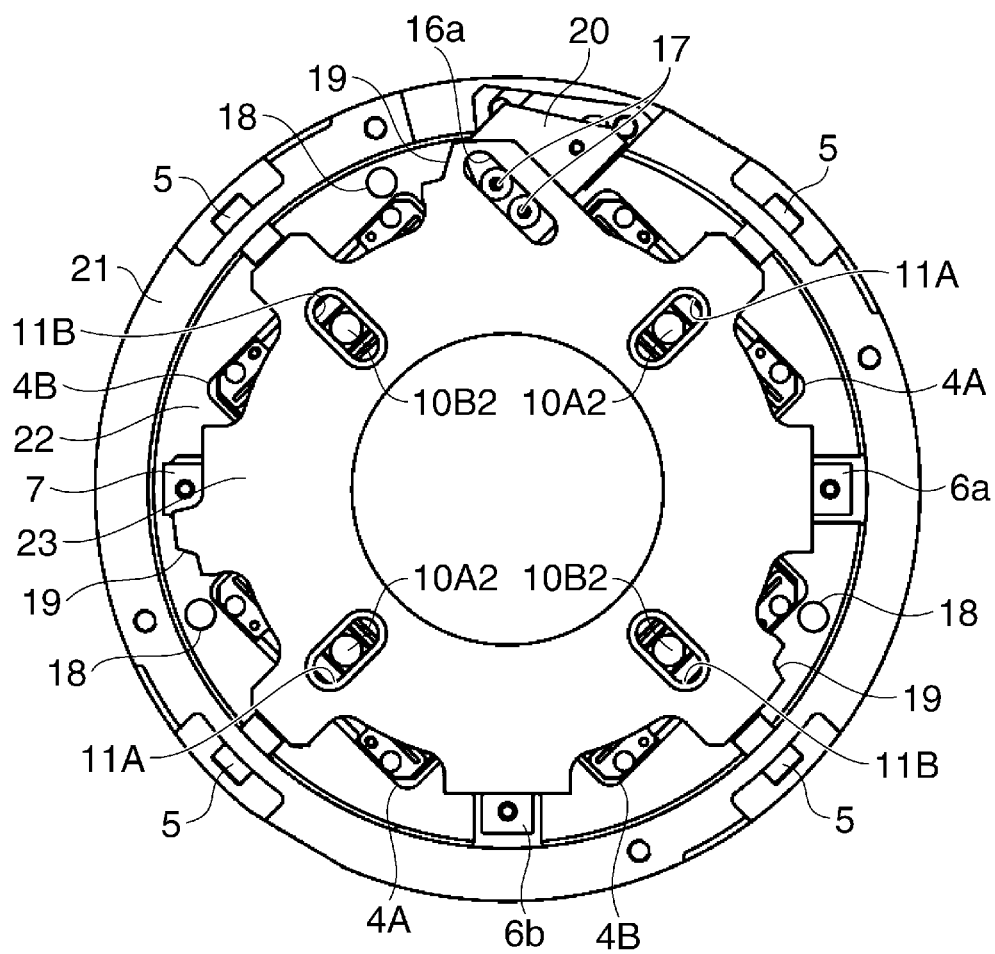
FIG. 7 is a top view showing the translational driving apparatus shown in FIG. 6.
Figure 7:
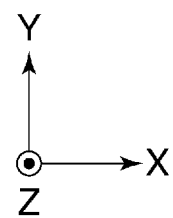

FIG. 6 is an exploded perspective view schematically showing a configuration of a translational driving apparatus 100A according to a second embodiment of the present invention. FIG. 7 is a top view of the translational driving apparatus 100A. A three-dimensional orthogonal coordinate system (X-axis, Y-axis, and Z-axis) is defined in FIG. 6 and FIG. 7 for convenience of description. As with the first embodiment, a thrust direction (thickness) of the translational driving apparatus 100A is defined as a Z-direction. An X-direction and a Y-direction that intersect perpendicularly mutually are defined in a plane that intersects perpendicularly with the Z-direction. It should be noted that the same reference numerals are attached to components of the translational driving apparatus 100A that are identical to the components of the translational driving apparatus 100 described in the first embodiment, and duplicated descriptions are omitted suitably.

The translational driving apparatus 100A has the first displacement sensors 6a and 6b, the second displacement sensor 7, a rotation regulating mechanism 20, a fixing portion 21, a holding portion 22, a movable body 23, and the drive units 4A and 4B. The drive units 4A and 4B are approximately identical to what are described in the first embodiment, and are arranged (fixed) on the holding portion 22. In the translational driving apparatus 100A, the holding portion 22 is arranged so as to be rotatable relatively to the fixing portion 21 in an XY plane and so as not to be displaced with respect to the fixing portion 21 in a Z-direction approximately.

In the second embodiment, a shape of output portions 10A2 and 10B2 that are respectively disposed on the driven bodies 10A and 10B is different from the shape of the output portions 10A1 and 10B1 described in the first embodiment. That is, although the output portions 10A1 and 10B1 have the square pole shape (see FIG. 1 and FIG. 2), the output portions 10A2 and 10B2 have a cylindrical shape (see FIG. 6 and FIG. 7). A reason is as follows. That is, the translational driving apparatus 100A holds the movable body 23 at a predetermined position by rotating the holding portion 22 to the fixing portion 21 as mention later. Accordingly, the output portions 10A2 and 10B2 that engage with the driving-force receiving parts 11A and 11B (equivalent to what are formed in the movable body 3 in the first embodiment) formed in the movable body 23 need to have configurations that allow changing angles relatively to the driving-force receiving parts 11A and 11B. Accordingly, the output portions 10A2 and 10B2 are formed in the cylindrical shape.

The output portions 10A2 and 10B2 respectively engage with the driving-force receiving parts 11A and 11B so as to be slidable, and receive no pressure force from the driving-force receiving parts 11A and 11B in the Z direction approximately as with the first embodiment. Moreover, frictional force that occurs between the inner surfaces of the output portion 10A2 and driving-force receiving part 11A and frictional force that occurs between the inner surfaces of the output portion 10B2 and driving-force receiving part 11B do not increase the drive loads of the drive units 4A and 4B. Accordingly, since the drive units 4A and 4B approximately do not receive external force that increases the drive loads, the movable body 23 is translated efficiently. As described later, the translational driving apparatus 100A regulates the rotation of the movable body 23 in the XY plane with the rotation regulating mechanism 20.

The translational driving apparatus 100A has the configuration that receives the support rollers 5 disposed in the movable body 23 by the roller support parts 8 formed in the fixing portion 21 as with the translational driving apparatus 100. The support rollers 5 are smoothly slidable inside the roller support parts 8 in their long-side directions. Accordingly, the movement of the movable body 23 in the Z direction is regulated by the fixing portion 21, and the translation in the XY plane within a predetermined area is allowed.

The arrangement forms of the first displacement sensors 6a and 6b and the second displacement sensor 7 are the same as the first embodiment. The first displacement sensor 6a detects a moving amount of the movable body 23 in the +Y direction. The first displacement sensor 6b detects a moving amount of the movable body 23 in the X direction. And the second displacement sensor 7 detects a relative moving amount between the movable body 23 and holding portion 22 in the −Y direction. The movable body 23 is translated in a desired direction in the XY plane on the basis of deviation between the information (outputs) from the first and second displacement sensors 6a, 6b, and 7 and the moving amount that is obtained by compositing the driving force vectors of the drive units 4A and 4B.

Moreover, in the translational driving apparatus 100A, when the drive units 4A and 4B are driven so that the holding portion 22 rotates with respect to the fixing portion 21, a difference occurs between the moving amounts in the Y direction that are detected by the first displacement sensor 6a and the second displacement sensor 7, respectively. Accordingly, the rotation angle of the holding portion 22 is detectable on the basis of this difference.

In a case where the rotation regulating mechanism 20 has slight play, a difference may occur between the moving amounts in the Y direction that are detected by the first displacement sensor 6a and the second displacement sensor 7, respectively, even if the drive units 4A and 4B are not driven so as to rotate the holding portion 22. Even in such a case, the movable body 23 is translated in the desired direction by controlling so as to correct the rotation of the movable body 23.

Figure 8:
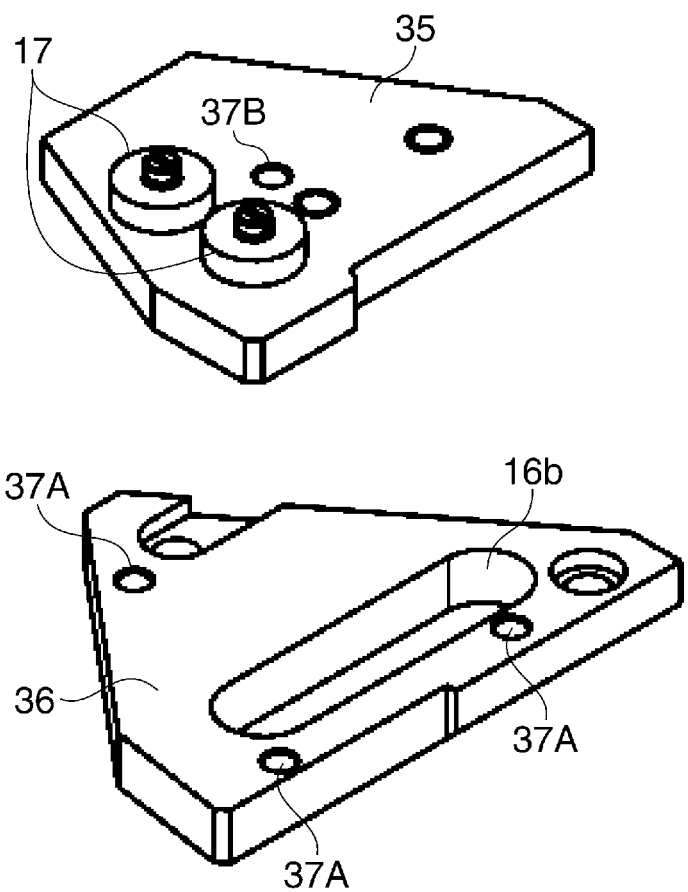
FIG. 8 is an exploded perspective view schematically showing a configuration of a rotation regulating mechanism of the translational driving apparatus shown in FIG. 6.

The rotation regulating mechanism 20 is fixed to the fixing portion 21. FIG. 8 is an exploded perspective view schematically showing a configuration of the rotation regulating mechanism 20. The rotation regulating mechanism 20 has a base 36 and slide member 35. The base 36 is fixed to the fixing portion 21. The base 36 has a sliding groove 16b that is a long hole elongated in a direction parallel to the driving direction of the driven bodies 10B of the drive units 4B in a state where the base 36 is fixed to the fixing portion 21. Moreover, three ball support portions 37A are formed on a side facing to the slide member 35 of the base 36. Three balls (bearings, not shown) will be arranged in the three ball support portions 37A, respectively. The balls arranged in the ball support portions 37A slide with the slide member 35.

Two ball bearings 17 are arranged on the upper surface (the side opposite to the side facing the base 36) of the slide member 35. The ball bearings 17 line in a direction parallel to the driving direction of the driven bodies 10A of the drive units 4A in a state where the base 36 is fixed to the fixing portion 21. Moreover, one ball support portion 37B is formed on the upper surface of the slide member 35, a ball (bearing, not shown) will be arranged in the ball support portion 37A. The ball arranged in the ball support portion 37A slides with the slide member 23. Two ball bearings (not shown) equivalent to the two ball bearings 17 are disposed on the bottom surface (the side of the base 36) of the slide member 35.

In a state where the rotation regulating mechanism 20 is attached to the fixing portion 21, the two ball bearings 17 disposed on the upper surface of the slide member 35 slidably engage with a sliding groove 16a that is a long hole formed in the movable body 23. Moreover, the two ball bearings (not shown) on the bottom surface of the slide member 35 engage with the sliding groove 16b formed in the base 36. The movement of the slide member 35 in the driving direction of the driven bodies 10A is regulated by the shape of the sliding groove 16b. Accordingly, when the drive units 4A are driven, the two ball bearings 17 roll within the sliding groove 16a, and the movable body 23 translates in the driving direction of the driven bodies 10A. On the other hand, when the drive units 4B are driven, the two ball bearings (not shown) on the bottom surface of the slide member 35 roll within the sliding groove 16b formed in the base 36, and the movable body 23 and slide member 35 integrally translate in the driving direction of the driven bodies 10B.

Since one ball is arranged between the movable body 23 and slide member 35 and three balls are arranged between the slide member 35 and base 36 when the movable body 23 is translated, the positional relationship between the movable body 23, slide member 35, and base 36 is kept suitably. This reduces the clearance between the two ball bearings 17 and sliding groove 16a, and the clearance between the two ball bearings (not shown) and sliding groove 16b. Accordingly, generation of play is prevented and the slide load is reduced. Although this embodiment employs the ball bearings 17 and balls, rod members and sleeve bearings that are made from material with small friction coefficients, such as PTFE, may be employed.

Thus, the position of the movable body 23 in the Z direction is determined by the support rollers 5 and roller support parts 8 only, and is not regulated by the drive units 4A and 4B in the translational driving apparatus 100A as with in the translational driving apparatus 100 according to the first embodiment. Accordingly, since the pressure force in the Z direction does not act between the movable body 23 and drive units 4A and 4B, the drive loads of the drive units 4A and 4B are settled approximately depending on the configuration of the drive units 4A and 4B themselves, and are not affected by the movable body 23. Accordingly, the translational driving apparatus 100 is able to translate the movable body 23 in the XY plane by efficiently giving the driving forces generated by the drive units 4A and 4B to the movable body 23.

Figure 9:
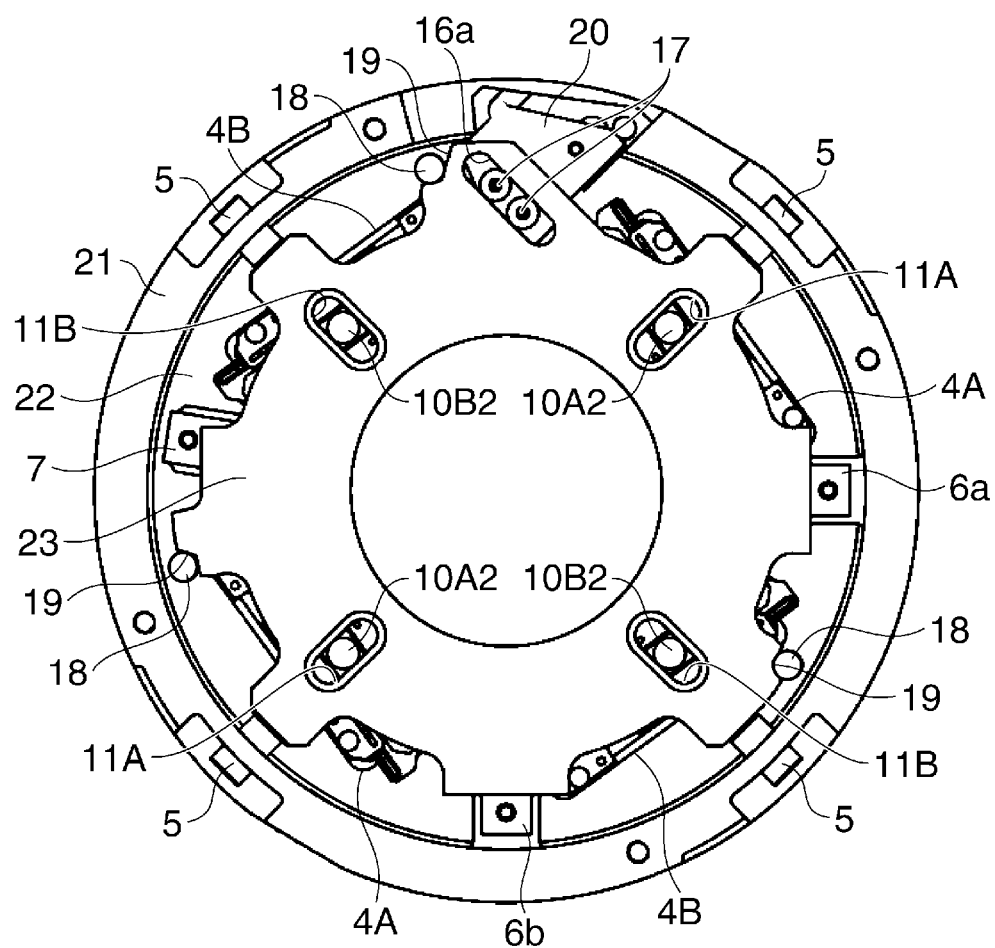
FIG. 9 is a plan view showing a state where translation of a movable body is regulated in the translational driving apparatus shown in FIG. 6.
Figure 9:
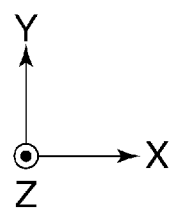

The translational driving apparatus 100A has a configuration that enables to hold the movable body 23 at a predetermined position and to regulate the translation of the movable body 23. FIG. 9 is a plan view showing a state where the translation of the moving body 23 is regulated in the translational driving apparatus 100A. Three engaging pins 18 are disposed on the holding portion 22, and three engagement parts 19 are formed in the movable body 23. FIG. 7 shows the state where the three engaging pins 18 do not engage with the three engagement parts 19 and the movable body 23 can translate in the XY plane.

Since the rotation regulating mechanism 20 regulates the rotation of the movable body 23, when the drive units 4A and 4B generate driving forces that drive the movable body 23 counterclockwise in the state shown in FIG. 7, the drive units 4A and 4B will try to move by the reaction force clockwise with respect to the movable body 23. The engaging pin 18 and the engagement part 19 carry out engagement, and stop rotation of the holding portion 22 in the place which the holding portion 22 holding the drive units 4A and 4B rotated clockwise in connection with this, and the holding portion 22 rotated to the position shown in FIG. 9. Thus, when the engaging pins 18 engage with the engagement parts 19, the translation of the movable body 23 is regulated. In this case, the rotation angle of the holding portion 22 is measured on the basis of the displacements that are respectively detected by the first displacement sensor 6a and second displacement sensor 7, and the control apparatus of the translational driving apparatus 100A stores the measured rotation angle as a control parameter.

When the regulation of the translation of the movable body 23 is released, the drive units 4A and 4B are driven so as to rotate the holding portion 22 counterclockwise by the rotation angle of the holding portion 22 that is stored as the control parameter. Since the translation of the movable body 23 is regulated when the translational driving apparatus 100A is not used, damage due to an external force acting on the movable body 23 is prevented, for example. Although the combination of the engaging pins 18 and engagement parts 19 are used as mechanisms that regulate the translation of the movable body 23 in this embodiment, the engagement mechanisms are not limited to this combination, but other engagement mechanisms may be used.

Figure 10:
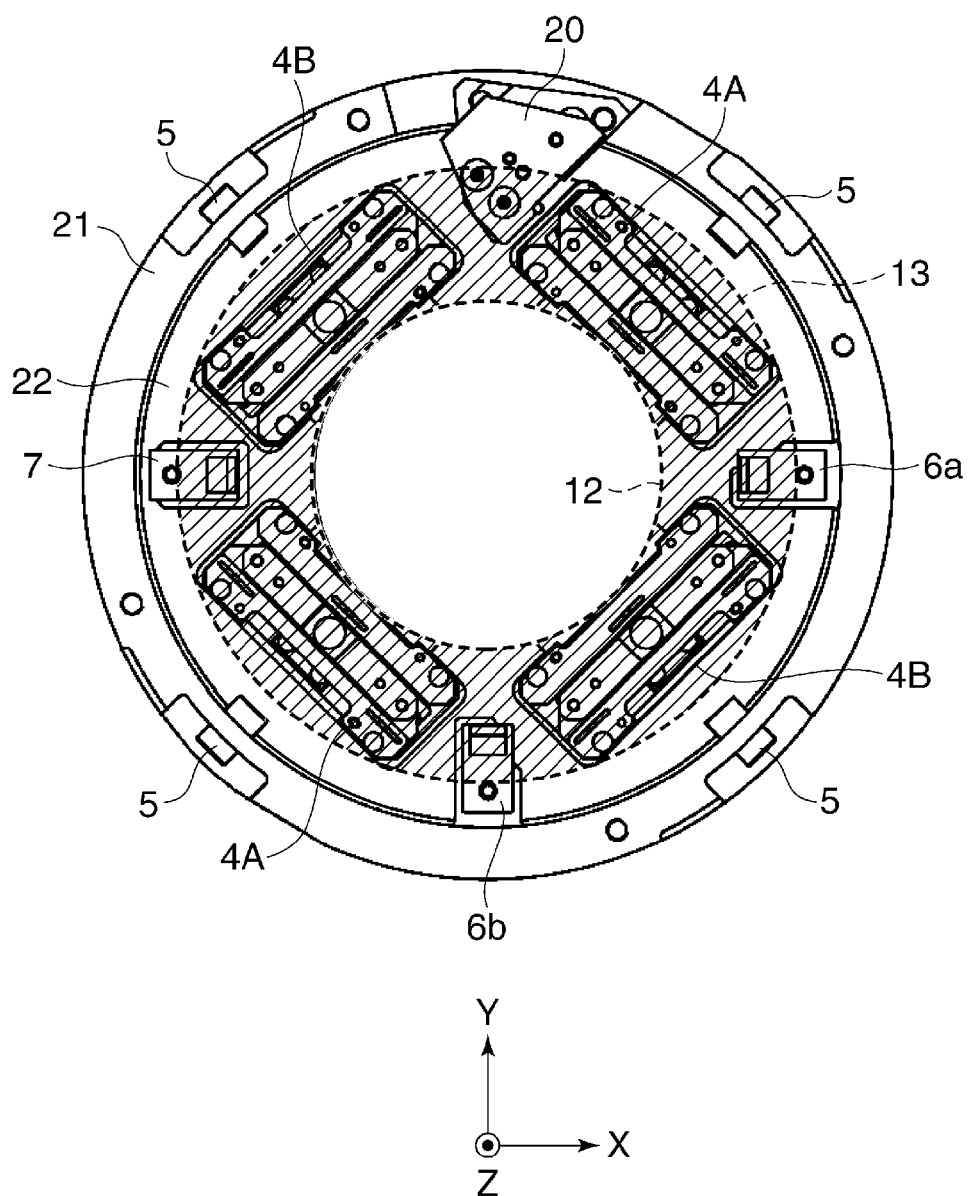
FIG. 10 is a plan view showing a positional relationship between drive units, support rollers, and the rotation regulating mechanism in the translational driving apparatus shown in FIG. 6.

FIG. 10 is a plan view showing a positional relationship between the drive units 4A and 4B, the support rollers 5, and the rotation regulating mechanism 20 in the translational driving apparatus 100A. Since the positional relationship between the drive units 4A and 4B and the support rollers 5 is the same as the first embodiment, the description is omitted. Moreover, the first circle 12 and second circle 13 in FIG. 10 are identical to the first circle 12 and second circle 13 described with reference to FIG. 4. The rotation regulating mechanism 20 is arranged outside the first circle 12. Accordingly, space is kept in the center of the holding portion 22. Accordingly, the translational driving apparatus 100A is able to be applied to the same uses of the translational driving apparatus 100.

Figure 11:
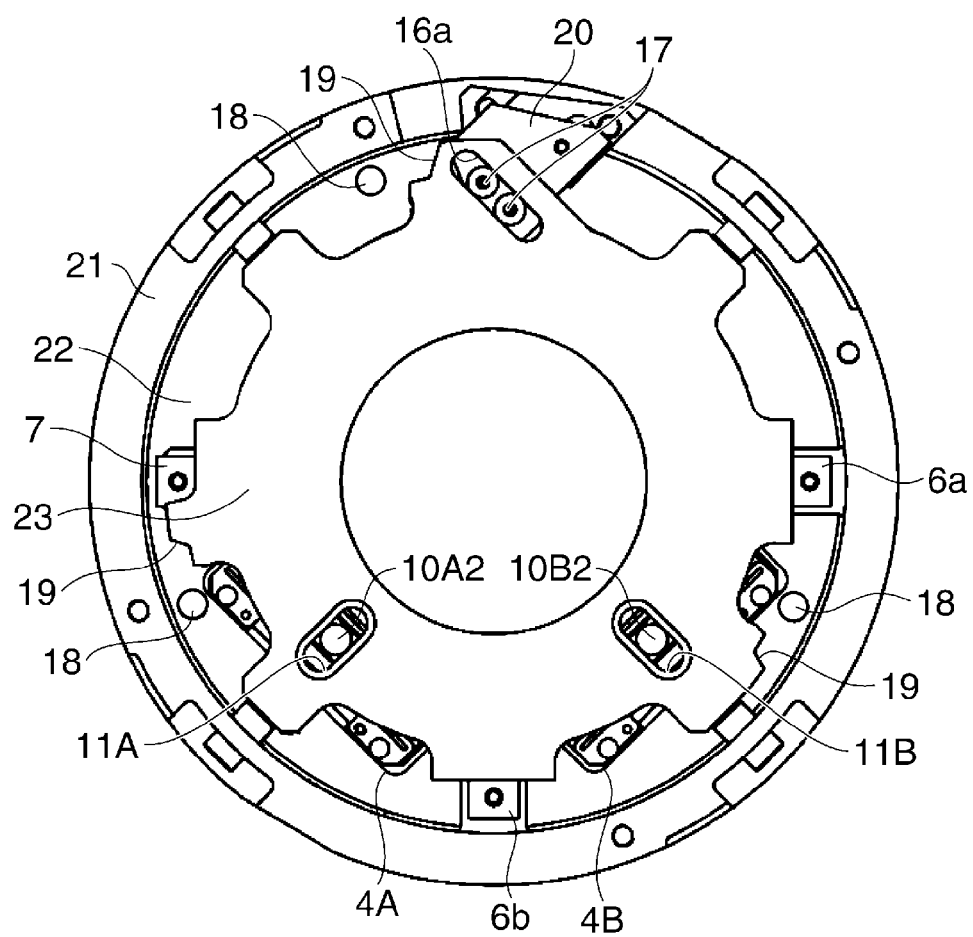
FIG. 11 is a top view schematically showing a configuration of a translational driving apparatus according to a third embodiment of the present invention.
Figure 11:
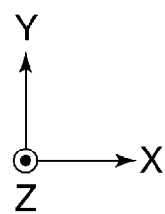

FIG. 11 is a top view schematically showing a configuration of a translational driving apparatus 100B according to a third embodiment of the present invention. The translational driving apparatus 100B is different from the translational driving apparatus 100A according to the second embodiment in the number of drive units. Although the translational driving apparatus 100A is provided with a pair of drive units 4A and a pair of drive units 4B, the translational driving apparatus 100B is provided with a single drive unit 4A and single drive unit 4B. There is no change in the other configurations. Accordingly, the translational driving apparatus 100B has the effects that are the same as the effects of the translational driving apparatus 100A, and the cost is reduced because the number of the drive units 4A and 4B is reduced.

Figure 12:
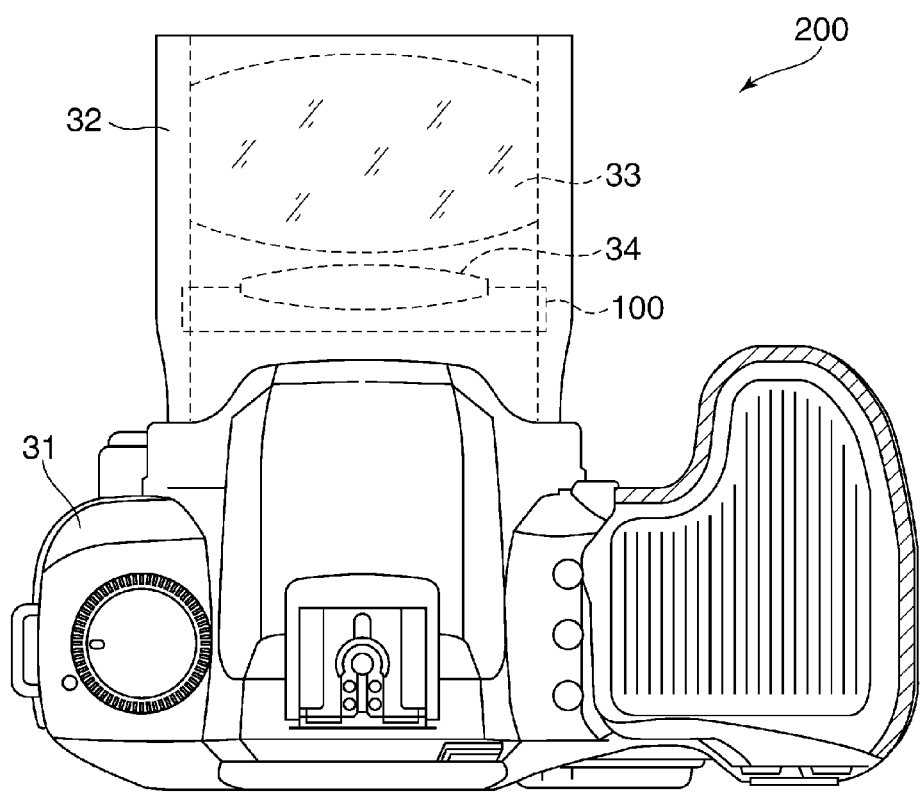
FIG. 12 is a top view schematically showing a configuration of an image pickup apparatus equipped with the translational driving apparatus shown in FIG. 1.

FIG. 12 is a top view schematically showing a configuration of an image pickup apparatus 200 equipped with the translational driving apparatus 100. The image pickup apparatus 200 mainly consists of a camera body 31 having an image pickup device and a lens barrel 32 that is detachable to the camera body 31. The lens barrel 32 has a plurality of lens groups 33 and the translational driving apparatus 100 as an image stabilization device that corrects an image blur of an object image. Light flux passing through the lens barrel 32 forms an image on the image pickup device. The image pickup device converts the optical image formed into an electrical signal by photoelectric conversion, and outputs it to an image processing circuit in the image pickup apparatus 200. The image processing circuit generates image data from the received electrical signal.

The translational driving apparatus 100 has an image stabilization lens 34 fixed in the center hole of the movable body 3, and is arranged in the lens barrel 32 so that the Z direction shown in FIG. 1 is coincident with an optical axis direction of the lens barrel 32. Accordingly, an image blur resulting from a camera shake, etc., is corrected by moving the image stabilization lens 34 in the plane that intersects perpendicularly with the optical axis, which enables a clear image to be taken.

When the translational driving apparatus 100A according to the second embodiment is applied as the image stabilization device, it is preferable to regulate the translation of the movable body 23 (the state in FIG. 9) when the image pickup apparatus 200 is not used. Accordingly, when an external force acts on the translational driving apparatus 100A during conveyance of the image pickup apparatus 200, damage, etc., to the translational driving apparatus 100A is prevented. Furthermore, when the translational driving apparatus 100B according to the third embodiment is applied to the image pickup apparatus 200, consumption of the battery that is a driving source of the image pickup apparatus 200 due to the drive of the translational driving apparatus 100B is reduced.

The embodiments mentioned above show examples of the present invention, and it is possible to combine the embodiments suitably.

For example, although the square-pole-shaped output portion 10A1 is disposed on the driven body 10A in the first embodiment, it is sufficient that the output portion has a surface that contacts with the long-side inner circumferential surface of the driving-force receiving part 11A. For example, a hexagonal pole shape, octagon pole shape, etc., are allowable. Moreover, the number of the drive units which constitute the translational driving apparatus concerning the present invention is not limited to two or four, and may be three or five or more. Moreover, for example, the drive unit 4A is configured so that the driven body 10A is linearly driven with respect to the vibration body 110. Alternatively, the drive unit 4A is configured so that the driven body 10A is fixed and the vibration body 110 is linearly driven with respect to the driven body 10A. In such a case, the output portion 10A1 should be disposed in the vibration body 110. The applications of the translational driving apparatuses concerning the embodiments of the present invention are not limited to the apparatuses mentioned above. They are able to be widely applied to an electronic apparatus equipped with a component that needs positioning by driving.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-199337, filed Oct. 7, 2015, which is hereby incorporated by reference herein in its entirety.

What is claimed is:

1. A driving apparatus comprising:
   drive units, each of which has a vibration-type actuator and an output portion that outputs a driving force;
   a holding portion that holds the drive units;
   a movable body that has driving-force receiving parts that slidably engage with the output portions, and that is driven by the drive units; and
   a fixing portion that supports the movable body so as to allow translation in any direction in a plane,
   wherein the fixing portion is shaped like a ring and has long holes elongated in a circumferential direction,
   wherein the movable body has projecting members projected from an outer periphery of the movable body in radial directions, and
   wherein the movable body is arranged inside the fixing portion with the projecting members being respectively inserted in the long holes.

2. The driving apparatus according to claim 1, wherein each of the vibration-type actuators comprises:
   a vibration body having an electro-mechanical energy conversion element and an elastic body; and a driven body being in contact with the vibration body in a pressing direction that intersects perpendicularly with the plane, wherein relative and linear movement generated between the vibration body and the driven body by a vibration excited in the vibration body by applying drive voltage to the electro-mechanical energy conversion element is output as the driving force of the output portion.

3. The driving apparatus according to claim 1, wherein a direction of the driving force that the output portion of one of the drive units applies to the movable body and a direction of the driving force that the output portion of another one of the drive units applies to the movable body intersect perpendicularly in the plane.

4. The driving apparatus according to claim 1, wherein each of the output portions is shaped like a post projected in a direction that intersects perpendicularly with the plane, wherein the movable body is shaped like a plate, and wherein each of the driving-force receiving parts is a long hole into which the output portion is inserted, has surfaces that contact with the output portion to receive the driving force, and has length that allows movement of the output portion in a direction that intersects perpendicularly with the direction of the driving force.

5. The driving apparatus according to claim 1, wherein at least two of the projecting members respectively engage with the long holes so as to slide with inner circumferential surfaces of the long holes in long-side directions of the long holes, and wherein a position of the movable body in a thrust direction with respect to the fixing portion is regulated by engaging the projecting members with the long holes.

6. The driving apparatus according to claim 1, wherein at least two of the projecting members are disposed at positions that are symmetrical about a center of the movable body in a radial direction of the movable body, and wherein the driving-force receiving parts are disposed on a straight line that connects the projecting members.

7. The driving apparatus according to claim 1, further comprising a rotation regulating mechanism that regulates rotation of the movable body within the plane, wherein the holding portion is shaped like a disc and is arranged in parallel to the movable body so as to be rotatable with respect to the fixing portion, and wherein the holding portion and the movable body have engagement mechanisms that mutually engage to regulate rotation of the holding portion within a certain angle range, when the holding portion is rotated.

8. The driving apparatus according to claim 1, wherein the projecting members are respectively arranged at positions that overlap with the drive units in a thrust direction of the fixing portion.

9. The driving apparatus according to claim 1, further comprising at least two sensors that measure moving amounts of the movable body, wherein a sensing direction of one of the sensors differs from a sensing direction of another one of the sensors.

10. The driving apparatus according to claim 9, wherein at least one of the sensors is arranged at the fixing portion and at least another one of the sensors is arranged at the holding portion.

11. A driving apparatus comprising:

drive units, each of which has a vibration body having an electro-mechanical energy conversion element and an elastic body, a driven body being in contact with the vibration body and moving relatively to the vibration body by vibration excited in the vibration body, and an output portion disposed on the driven body;

a holding portion that holds the drive units;

a movable body that has driving-force receiving parts that engage with the output portions to receive driving forces of the output portions, and that is driven by the drive units; and a fixing portion that movably supports the movable body, wherein the fixing portion is shaped like a ring and has long holes elongated in a circumferential direction, wherein the movable body has projecting members projected from an outer periphery of the movable body in radial directions, and wherein the movable body is arranged inside the fixing portion with the projecting members being respectively inserted in the long holes.

12. An electronic apparatus comprising:

drive units, each of which has a vibration-type actuator and an output portion that outputs a driving force;

a holding portion that holds the drive units;

a movable body that has driving-force receiving parts that slidably engage with the output portions, and that is driven by the drive units;

a fixing portion that supports the movable body so as to allow translation in any direction in a plane; and a member that is held by the movable body as an object to be positioned, wherein the fixing portion is shaped like a ring and has long holes elongated in a circumferential direction, wherein the movable body has projecting members projected from an outer periphery of the movable body in radial directions, and wherein the movable body is arranged inside the fixing portion with the projecting members being respectively inserted in the long holes.

13. An electronic apparatus comprising:

drive units, each of which has a vibration body having an electro-mechanical energy conversion element and an elastic body, a driven body being in contact with the vibration body and moving relatively to the vibration body by vibration excited in the vibration body, and an output portion disposed on the driven body;

a holding portion that holds the drive units;

a movable body that has driving-force receiving parts that engage with the output portions to receive driving forces of the output portions, and that is driven by the drive units;

a fixing portion that movably supports the movable body; and a member that is held by the movable body as an object to be positioned, wherein the fixing portion is shaped like a ring and has long holes elongated in a circumferential direction, wherein the movable body has projecting members projected from an outer periphery of the movable body in radial directions, and wherein the movable body is arranged inside the fixing portion with the projecting members being respectively inserted in the long holes.

\* \* \* \* \*